US 8,861,151 B2

(12) United States Patent
    Sushihara

(10) Patent No.: US 8,861,151 B2
(45) Date of Patent: Oct. 14, 2014

(54) OVERVOLTAGE PROTECTION CIRCUIT AND SEMICONDUCTOR INTEGRATED CIRCUIT

(75) Inventor: Akihiro Sushihara, Hiyazaki (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 493 days.

(21) Appl. No.: 13/369,394

(22) Filed: Feb. 9, 2012

(65) Prior Publication Data

US 2012/0206846 A1 Aug. 16, 2012

(30) Foreign Application Priority Data

Feb. 16, 2011 (JP) ................. 2011-030701

(51) Int. Cl.
    *H02H 9/00* (2006.01)
    *H01L 27/02* (2006.01)
    *H02H 9/04* (2006.01)

(52) U.S. Cl.
    CPC .......... *H02H 9/046* (2013.01); *H01L 27/0274* (2013.01)
    USPC ............................. 361/56; 361/91.1; 361/111

(58) Field of Classification Search
    CPC ........... H02H 9/04; H02H 9/42; H02H 9/046; H02H 7/003; H02H 3/20; H02H 3/22; H04F 1/00; H04F 3/02; H01L 27/0248; H01L 27/0251; H01L 27/0266; H03K 17/0822
    See application file for complete search history.

(56) References Cited

U.S. PATENT DOCUMENTS

| 4,949,139 | A  | * | 8/1990  | Korsh et al. .................. 327/391 |
| 5,212,617 | A  | * | 5/1993  | Hueser et al. ................. 361/56  |
| 5,400,202 | A  | * | 3/1995  | Metz et al. .................... 361/56  |
| 6,635,930 | B1 | * | 10/2003 | Hauptmann et al. ......... 257/355 |
| 8,054,596 | B2 | * | 11/2011 | Koyama et al. ............... 361/56  |
| 8,358,490 | B2 | * | 1/2013  | Jeon et al. .................... 361/56  |

FOREIGN PATENT DOCUMENTS

| JP | 2007-059543 | 3/2007 |
| JP | 2009-111337 | 5/2009 |

* cited by examiner

*Primary Examiner* — Jared Fureman
*Assistant Examiner* — Terrence Willoughby
(74) *Attorney, Agent, or Firm* — Volentine & Whitt, PLLC

(57) ABSTRACT

Disclosed is an overvoltage protection circuit which includes a first terminal through which a first voltage is supplied to an internal circuit; a second terminal through which a second voltage is supplied; a rectifier having an input end connected to the first terminal and having an output end; and first-stage to n-th-stage switching elements which are connected in parallel to one another. The first-stage to n-th-stage switching elements have first to n-th controlling ends, respectively. Each of the switching elements has first and second controlled ends connected to the first terminal and the second terminal, respectively. The rectifier is configured to output a control voltage from the output end thereby to cause the first-stage to n-th-stage switching elements to be turned on, in response to receipt of an overvoltage from the first terminal.

15 Claims, 18 Drawing Sheets

US 8,861,151 B2

OVERVOLTAGE PROTECTION CIRCUIT AND SEMICONDUCTOR INTEGRATED CIRCUIT

BACKGROUND OF THE INVENTION

1. Field of the Invention

The present invention relates to an overvoltage protection circuit which protects an internal circuit of a semiconductor integrated circuit from abnormal overvoltage.

2. Description of the Related Art

Semiconductor integrated circuits contain internal circuits such as an inverter circuit, a buffer circuit, and various passive elements, and has incorporated therein a surge protection circuit for protecting such internal circuits from abnormal overvoltage. For example, in the process of manufacturing or testing of electronic instruments, electrostatic discharge (ESD) can occur due to static electricity produced by friction or electrification, and thereby an excessively large abnormal voltage (surge voltage) can instantaneously be input through an external terminal of a semiconductor chip. The surge protection circuit operates in response to the abnormal voltage, and protects destruction and maloperation of the internal circuit, by allowing overcurrent (surge current) produced by the abnormal voltage to be drawn into a GND interconnect. Typical circuits of such surge protection circuits are disclosed in Japanese Patent Application Publication Nos. 2009-111337 and 2007-59543.

FIG. 1 schematically illustrates an exemplary conventional surge protection circuit 100. As illustrated in FIG. 1, the surge protection circuit 100 has a plurality of n-channel MOS transistors $N0_1$, $N0_2$, ..., $N0_{n-1}$, $N0_n$ connected in parallel, between an input terminal 101 and a VSS terminal 102. Each of the MOS transistors has a source, a gate, a back gate connected to the VSS terminal 102, and a drain connected to the input terminal 101. Also an internal circuit 90 is connected to the input terminal 101.

When an excessively large abnormal voltage is input through the input terminal 101, each of the MOS transistors $N0_1$ to $N0_n$ starts to respond to the surge voltage, upon being triggered by breakdown of a parasitic diode configured by the drain and the back gate. In each of the MOS transistors $N0_1$ to $N0_n$, the parasitic bipolar transistor (npn-type bipolar transistor) turns on in response to current running into the base (substrate) of the parasitic bipolar transistor, and current flows to the emitter. As a consequence, the MOS transistors $N0_1$ to $N0_n$ draw the surge current into the VSS terminal 102. Accordingly, the internal circuit 90 can be protected from the surge voltage, if the MOS transistors $N0_1$ to $N0_n$ successfully draw the surge current into the VSS terminal 102, before the internal circuit 90 responds to the surge voltage.

The conventional surge protection circuit 100 has, however, been suffering from a problem that it may fail in predominantly draw the surge current into the VSS terminal 102, and that the internal circuit 90 may therefore be destructed in response to the surge voltage, due to variation in the time of causing breakdown of the plurality of MOS transistors $N0_1$ to $N0_n$.

In view of the foregoing, it is an object of the present invention to provide an overvoltage protection circuit which can surely protect the internal circuit from abnormal overvoltage, and to provide a semiconductor integrated circuit having the same.

SUMMARY OF THE INVENTION

According to an aspect of the present invention, there is provided an overvoltage protection circuit which includes: a first terminal through which a first voltage is supplied to an internal circuit; a second terminal through which a second voltage is supplied; a rectifier which has an input end connected to the first terminal, and an output end; and first-stage to n-th-stage switching elements which are connected in parallel to one another where n is an integer of 2 or larger. The first-stage to n-th-stage switching elements have first to n-th controlling ends respectively through which an output voltage from the output end of the rectifier is applied. Each of the switching elements has first and second controlled ends connected to the first terminal and the second terminal, respectively. The rectifier is configured to output a control voltage from the output end thereby to cause the first-stage to n-th-stage switching elements to be turned on to establish electrical continuity between the first and second controlled ends, in response to receipt of an overvoltage not smaller than a predetermined voltage that is higher than the second voltage from the first terminal.

According to another aspect of the present invention, there is provided a semiconductor integrated circuit which has the overvoltage protection circuit and the internal circuit.

In response to overvoltage, the rectifier can turn on the plurality of switching elements through which overcurrent can successfully be drawn into the second terminal. The internal circuit therefore can surely be protected from abnormal overvoltage.

DETAILED DESCRIPTION OF THE INVENTION

Figure 1:
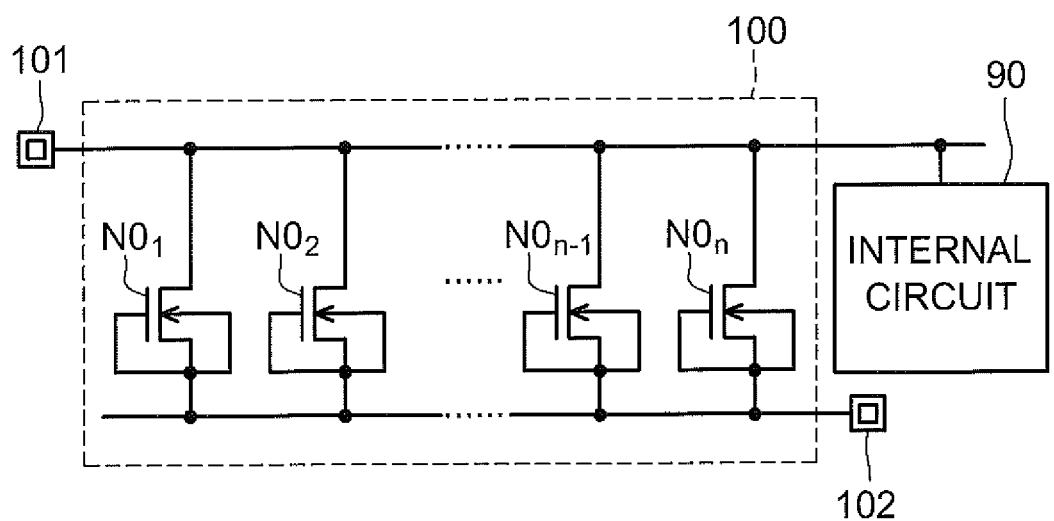
FIG. 1 schematically illustrates a configuration of a conventional surge protection circuit.

Various embodiments of the present invention will be explained below with reference to the attached drawings, in which like elements are indicated by like reference characters.

First Embodiment

Figure 2:
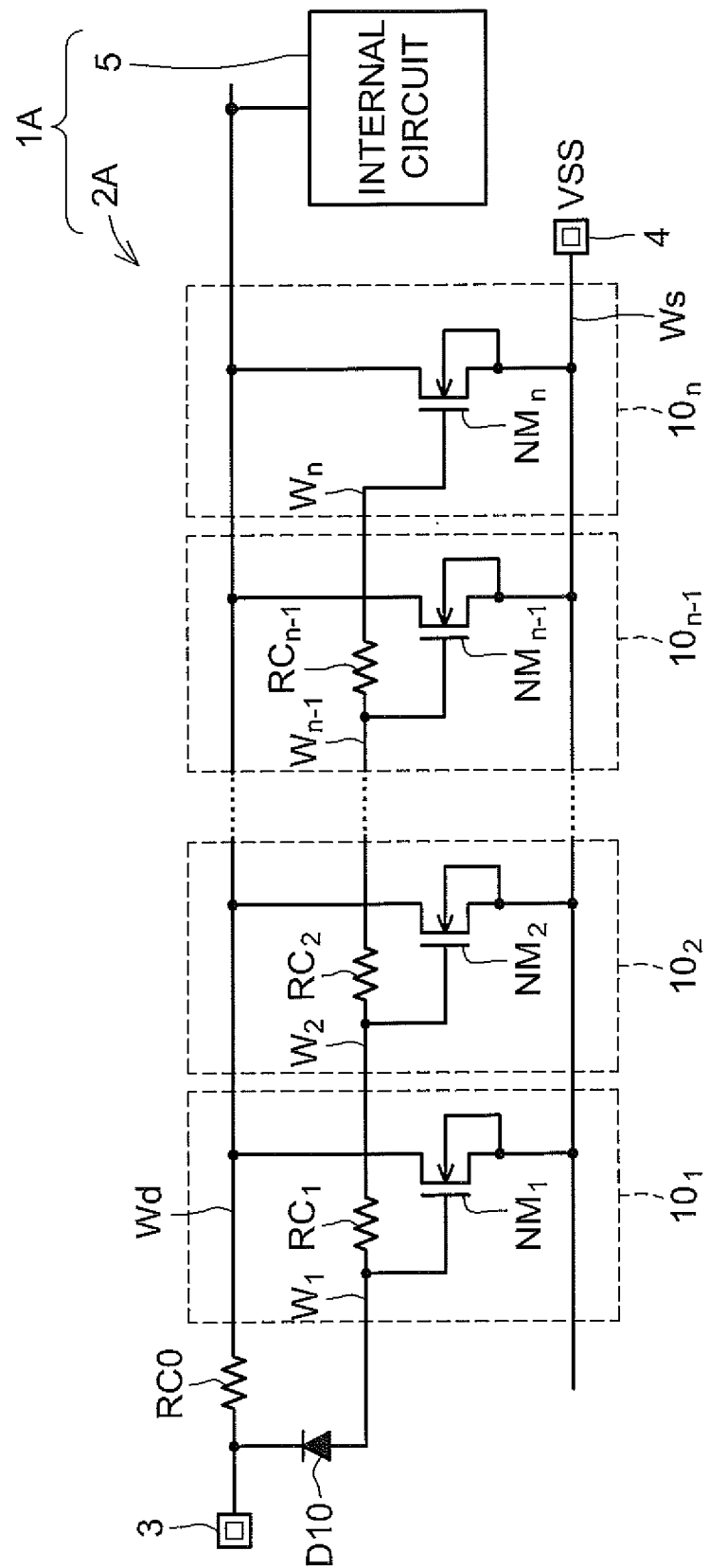
FIG. 2 schematically illustrates a configuration of a semiconductor integrated circuit according to a first embodiment of the present invention.

FIG. 2 is a diagram schematically illustrating a configuration of a semiconductor integrated circuit 1A according to a first embodiment of the present invention. The semiconductor integrated circuit 1A has an input terminal 3, an overvoltage protection circuit 2A, a VSS terminal 4 and an internal circuit 5. The internal circuit 5 is an integrated circuit which contains an inverter circuit, a buffer circuit and so forth, and operates in response to voltage supplied through the input terminal 3, via an interconnect line Wd and a resistor element RC0. The VSS terminal 4 is a terminal through which a voltage (earth-termination voltage, for example) lower than a predetermined source voltage (VDD voltage, for example) is supplied.

The overvoltage protection circuit 2A has, as illustrated in FIG. 2, n protection circuit units $10_1, 10_2, \ldots, 10_{n-1}, 10_n$ in the first stage to the n-th stage (n is an integer of 4 or larger), which are connected in parallel to one another between the input terminal 3 and the VSS terminal 4. The protection circuit units $10_1, 10_2, \ldots, 10_{n-1}, 10_n$ respectively have n-channel MOS transistors $NM_1, NM_2, \ldots, NM_{n-1}, NM_n$ as switching elements. It is to be noted that n indicating the number of the protection circuit units $10_1$ to $10_n$ is not always necessarily be 4, and instead can be 2 or 3. The number can be determined by a value obtained by dividing the total gate width of the MOS transistors $NM_1$ to $NM_n$, which is supposed to satisfy a desired level of ESD resistance, by the number of gates of the MOS transistors $NM_1$ to $NM_n$.

Each of the MOS transistors $NM_1$ to $NM_n$ has a drain (one controlled end) which is connected to the interconnect line Wd extended from one end of the resistor element RC0, a source (another controlled end) which is connected to an interconnect line Ws extended from the VSS terminal 4, and a gate (controlling end). The back gate is connected to the interconnect line Ws, together with the source.

As illustrated in FIG. 2, a pn-junction-type diode D10 is connected between the gates of the MOS transistors $NM_1$ to $NM_n$ and the input terminal 3. The diode D10 is a rectifier that leads to reverse-biased breakdown when surge voltage not smaller than the breakdown voltage is applied through the input terminal 3. In this embodiment, the cathode of the diode D10, as an input end to which the reverse-biased voltage is applied, is connected to the input terminal 3. On the other hand, the anode of the diode D10, as an output end, is connected via an interconnect line $W_1$ to the gates of the MOS transistors $NM_1$ to $NM_n$.

The protection circuit units $10_1$ to $10_{n-1}$ have n-1 resistor elements $RC_1, RC_2, \ldots, RC_{n-1}$, respectively. These n-1 resistor elements $RC_1, RC_2, \ldots, RC_{n-1}$ are connected in series between the gate of the final-stage MOS transistor $NM_n$ and the input terminal 3. The first-stage (primary-stage) resistor element $RC_1$ has one end connected via the interconnect line $W_1$ to the anode of the diode D10, and the other end connected via an interconnect line $W_2$ to the second-stage resistor element $RC_2$. The first-stage resistor element $RC_1$ is connected also between the gate of the first-stage MOS transistor $NM_1$, and the gate of the next-stage MOS transistor $NM_2$. The second-stage resistor element $RC_2$ has one end connected via the interconnect line $W_2$ to the preceding-stage resistor element $RC_1$, and has the other end connected via an interconnect line $W_3$ to the next-stage resistor element $RC_3$. The second-stage resistor element $RC_2$ is connected also between the gate of the second-stage MOS transistor $NM_2$ and the gate of the next-stage MOS transistor $NM_3$. In this embodiment, the k-th-stage (k is an arbitrary integer from 2 to n−1) resistor element $RC_k$ has one end connected via an interconnect line $W_k$ to the preceding-stage resistor element $RC_{k-1}$, and has the other end connected via an interconnect line $W_{k+1}$ to the next-stage resistor element $RC_{k+1}$. The k-th-stage resistor element $RC_k$ is connected also between the gate of the k-th-stage MOS transistor $NM_k$ and the gate of the next-stage MOS transistor $NM_{k+1}$.

The resistor element RC0 is connected between all drains of the MOS transistors $NM_1$ to $NM_n$ and the cathode of the diode D10. Accordingly, the resistor element RC0 applies voltage, which is lower than the voltage applied through the input terminal 3 to the cathode of the diode D10, to the drains of the MOS transistors $NM_1$ to $NM_n$.

Figure 3:
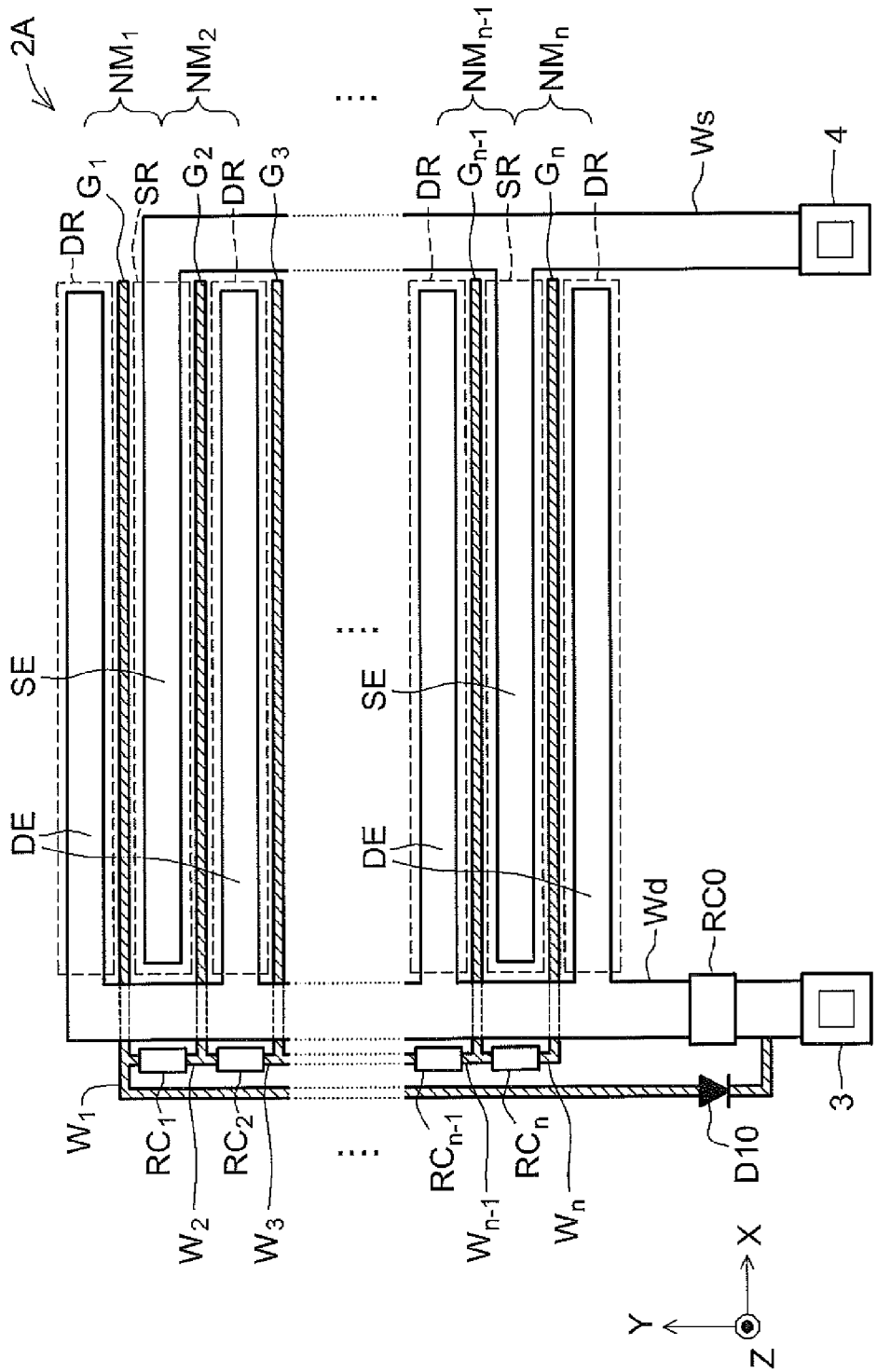
FIG. 3 schematically illustrates an exemplary layout of the overvoltage protection circuit according to the first embodiment.

FIG. 3 is a diagram schematically illustrating an exemplary layout of the overvoltage protection circuit 2A. As illustrated in FIG. 3, the interconnect line Wd extends from one end of the resistor element RC0 in the Y-axis direction, and the interconnect line Ws extends from the VSS terminal 4 in the Y-axis direction. On the other hand, a plurality of strip-shaped drain interconnects DE, DE, ... extend from the interconnect line Wd on one side in the positive X-axis direction (direction orthogonal to the Y-axis direction), and a plurality of strip-shaped source interconnects SE, SE, ... extend from the interconnect line Ws on the other side in the negative X-axis direction. The drain interconnects DE and the source interconnects SE are alternately arranged in the Y-axis direction. Right under the drain interconnects DE, drain regions DR composing the MOS transistors are formed, and, right under the source interconnects SE, source regions SR composing the MOS transistors are formed. Between the source interconnects SE and the drain interconnects DE, gate interconnects (gate electrodes) $G_1$ to $G_n$ respectively composing the MOS transistors $NM_1$ to $NM_n$ are formed. The gate interconnects $G_1, \ldots, G_n$ are extended respectively from the interconnect lines $W_1, \ldots, W_n$ in the X-axis direction.

Figure 4:
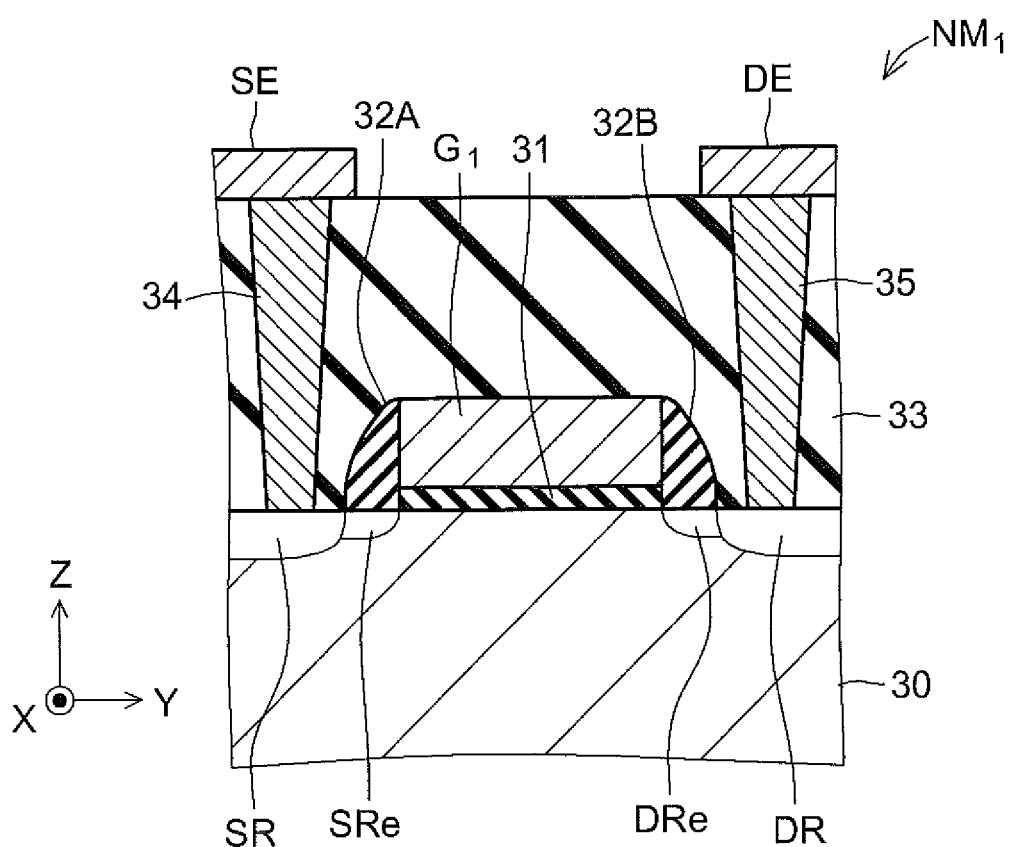
FIG. 4 is a cross sectional view schematically illustrating an exemplary configuration of a MOS transistor according to the first embodiment.

FIG. 4 is a cross sectional view schematically illustrating an exemplary structure of the MOS transistor $NM_1$ of this embodiment. As illustrated in FIG. 4, the MOS transistor $NM_1$ has the gate interconnect $G_1$ which is formed on the main surface of a P-type semiconductor substrate 30, while placing in between a gate insulating film 31 composed of a silicon oxide film or the like. The gate interconnect $G_1$ can be formed using, for example, an impurity-doped polysilicon material. The gate interconnect $G_1$ has, formed on both side faces thereof, sidewall spacers 32A, 32B composed of an insulating material. On one side of the gate interconnect $G_1$, the source region SR, which is an n-type impurity diffused region, is formed in the surficial portion of the P-type semiconductor substrate 30, and on the other side, the drain region DR, which is an n-type impurity diffused region, is formed in the surficial portion of the P-type semiconductor substrate 30. An extension region (n-type impurity diffused region) DRe is formed so as to extend from one end of the drain region DR in the horizontal direction, and also an extension region (n-type impurity diffused region) SRe is formed so as to extend from one end of the source region SR in the horizontal direction. The source region SR is electrically connected, through a contact plug 34 provided in an insulating interlayer 33, to the source interconnect SE as an upper interconnect. On the other hand, the drain region DR is electrically connected, through a contact plug 35 provided in the insulating interlayer 33, to the drain interconnect DE as the upper interconnect.

Also other MOS transistors $NM_2$ to $NM_n$ have almost similar structures as that of the MOS transistor $NM_1$, except for arrangement of the source regions SR and the drain regions DR. Note that the structures of the MOS transistors are not limited to that illustrated in FIG. 4, while allowing adoption of any other publicly known structures of MOS transistor.

The MOS transistors $NM_1$ to $NM_n$ are arranged in the Y-axis direction, as illustrated in FIG. 3. The gate interconnects $G_1, \ldots, G_n$ of the MOS transistors $NM_1, \ldots, NM_n$ are arranged in the ascending order of distance in interconnect length from the anode (output end) of the diode D10. More specifically, the interconnect length between the gate interconnect $G_1$ and the anode of the diode D10 (approximately same with the length of the interconnect line $W_1$) is shorter than the interconnect length between other gate interconnects $G_2$ to $G_n$ and the anode of the diode D10. The interconnect length between the k-th-stage gate interconnect $G_k$ (k is an arbitrary integer of 2 to n−1) and the anode of the diode D10, is shorter than the interconnect length between the (k+1)-th-stage gate interconnect $G_{k+1}$ and the anode of the diode D10. Accordingly, the gate interconnect $G_n$ in the final stage (n-th stage) has the largest interconnect distance away from the anode of the diode D10.

On the other hand, the drain regions DR, . . . , DR of the MOS transistors $NM_n, NM_{n-}, \ldots, NM_1$ are arranged in the ascending order of distance in interconnect length from the input terminal 3. More specifically, as illustrated in FIG. 3, the interconnect length between the drain region DR of the final-stage MOS transistor $NM_n$ and the input terminal 3 is shorter than the interconnect length between the drain regions DR of the other MOS transistors $NM_{n-1}$ to $NM_1$ and the input terminal 3. The interconnect length between the drain region DR of the k-th-stage MOS transistor $NM_k$ and the input terminal 3 is shorter than the interconnect length between the drain region DR of the (k−1)-th-stage MOS transistor $NM_{k-1}$ and the input terminal 3. Accordingly, the drain region DR of the primary-stage (first stage) MOS transistor $NM_1$ has the largest interconnect distance away from the input terminal 3.

Figure 5:
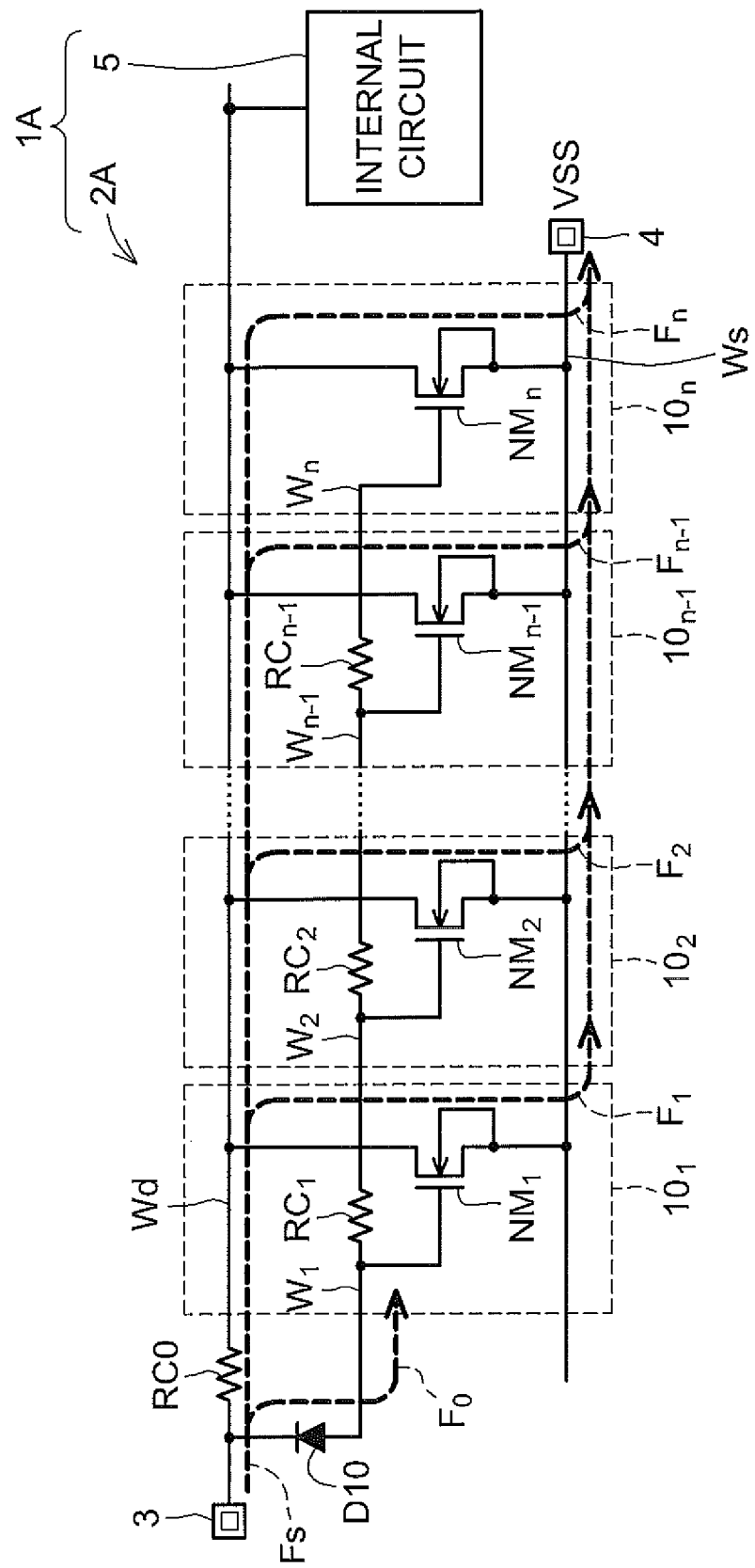
FIGS. 5 and 6 are diagrams each schematically illustrating the propagation and branching paths of surge current in the overvoltage protection circuit according to the first embodiment.
Figure 6:
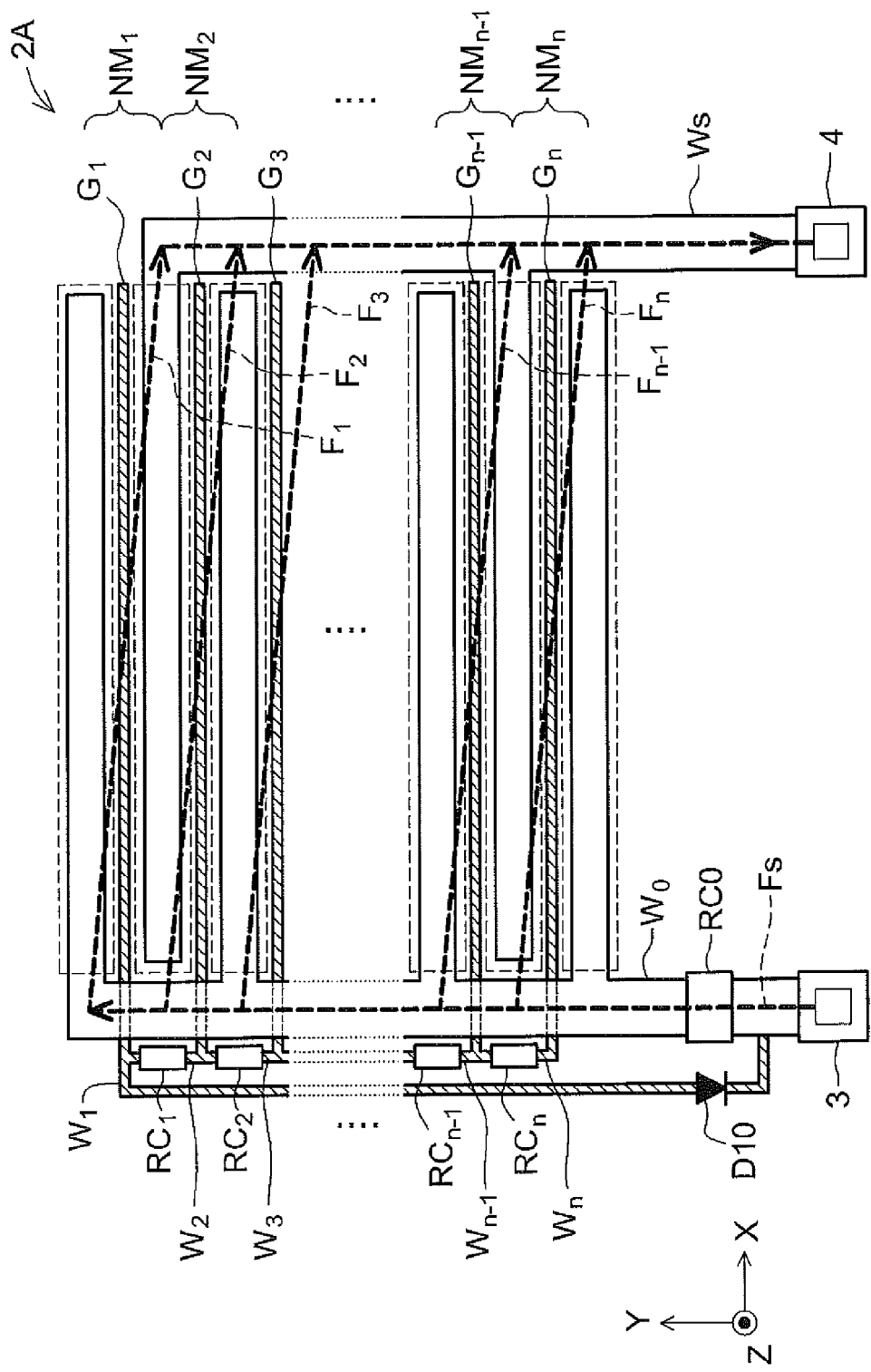

Next, operations of the overvoltage protection circuit 2A will be explained. FIGS. 5 and 6 are diagrams each schematically illustrating the propagation and branching paths of surge current Fs when surge voltage is input through the input terminal 3.

When surge voltage which sharply increases with time is input through the input terminal 3, by virtue of presence of the resistor element RC0, the diode D10 goes into breakdown and starts to respond, in advance of breakdown of the internal circuit 5. The anode of the diode D10 then elevates potential of the interconnect line $W_1$. If the elevated potential exceeds the threshold value of the primary-stage MOS transistor $NM_1$, the MOS transistor $NM_1$ changes from off-state to on-state so as to establish electrical continuity, so that a path of current $F_1$ (surge path) is formed between the input terminal 3 and the VSS terminal 4. Thereafter, if potential of the interconnect line $W_2$ exceeds the threshold value of the second-stage MOS transistor $NM_2$, the MOS transistor $NM_2$ changes from off-state to on-state, and thereby a path of current $F_2$ (surge path) is formed between the input terminal 3 and the VSS terminal 4. By virtue of presence of the resistor element $RC_1$, the MOS transistor $NM_2$ turns on slightly behind the MOS transistor $NM_1$.

Thereafter, if potential of the interconnect line $W_k$ (k is any one integer from 3 to n) exceeds the threshold value of the k-th-stage MOS transistor $NM_k$, the MOS transistor $NM_k$ changes from off-state to on-state, and thereby a path of current $F_k$ (surge path) is formed between the input terminal 3 and the VSS terminal 4. By virtue of presence of the resistor element $RC_{k-1}$, the k-th-stage MOS transistor $NM_k$ turns on slightly behind the preceding-stage MOS transistor $NM_{k-1}$. Accordingly, upon input of surge voltage through the input terminal 3, the MOS transistors $NM_1, \ldots, NM_n$ sequentially turn on, so as to form a path of surge current Fs between the input terminal 3 and the VSS terminal 4.

As explained in the above, according to the surge protection circuit 2A of the first embodiment, upon input of surge voltage through the input terminal 3, the diode D10 leads to breakdown earlier than the internal circuit 5, so as to allow the MOS transistors $NM_1$ to $NM_n$ to turn on. Accordingly, as compared with the conventional configuration illustrated in FIG. 1, surge current Fs can be drawn into the VSS terminal 4 within a shorter time, so that elements in the internal circuit 5 can surely be prevented from being destructed.

Since the MOS transistors $NM_1, \ldots, NM_n$ change from off-state to on-state in this order, the surge current paths are prevented from being localized in a limited area. As illustrated in FIG. 6, since the MOS transistors $NM_1, \ldots, NM_n$ turn on sequentially from the MOS transistor located farthest from the input terminal 3, so that the surge current may be allowed to flow while being branched over the entire area of the MOS transistors $NM_1, \ldots, NM_n$. Assuming now that the MOS transistors $NM_1, \ldots, NM_n$ turned on sequentially from the MOS transistor located closest from the input terminal 3, the current flows through the shortest path, so that currents $F_1$, $F_2$ hardly flow in the MOS transistors $NM_1$, $NM_2$ located away from the input terminal 3, and thereby the propagation path of surge current is localized in a limited area. In this case, potential of the input terminal 3 may not be lowered within a short time.

Figure 7:
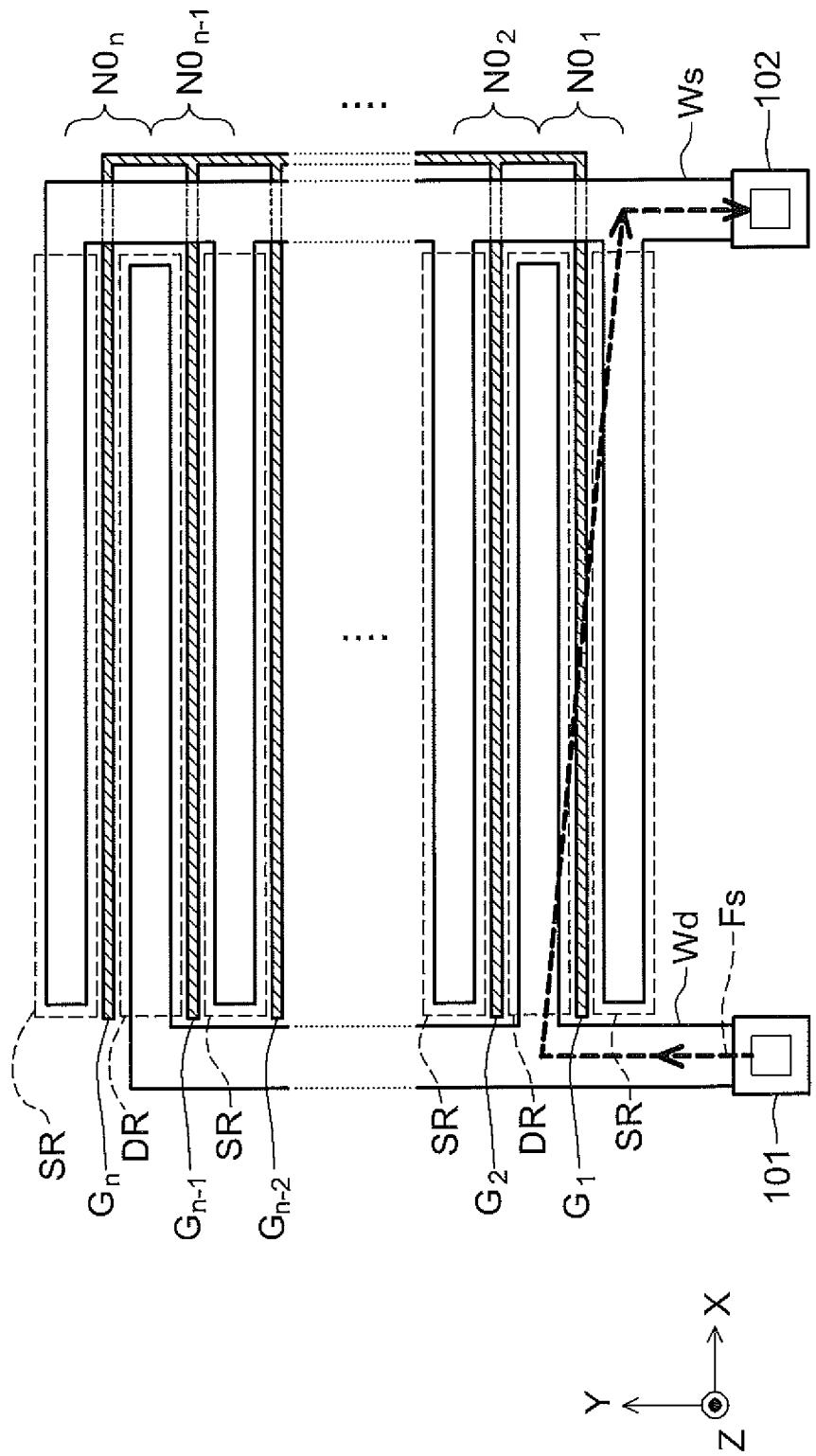
FIG. 7 is a diagram schematically illustrating an exemplary layout of the conventional surge protection circuit illustrated in FIG. 1.

FIG. 7 is a diagram schematically illustrating an exemplary layout of the conventional surge protection circuit illustrated in FIG. 1. As illustrated in FIG. 7, the interconnect line Wd extends from the input terminal 101 in the Y-axis direction, and the interconnect line Ws extends from the VSS terminal 102 in the Y-axis direction. On the other hand, a plurality of strip-shaped drain interconnects extend from the interconnect line Wd on one side in the positive X-axis direction (direction orthogonal to the Y-axis direction), and a plurality of strip-shaped source interconnects extend from the interconnect line Ws on the other side in the negative X-axis direction. Right under the drain interconnects, the drain regions DR composing the MOS transistors are formed, and, right under the source interconnects, the source regions SR composing the MOS transistors are formed. Also the gate interconnects (gate electrodes) $G_1$ to $G_n$ respectively composing the MOS transistors $N0_1$ to $N0_n$ are formed.

Figure 8:
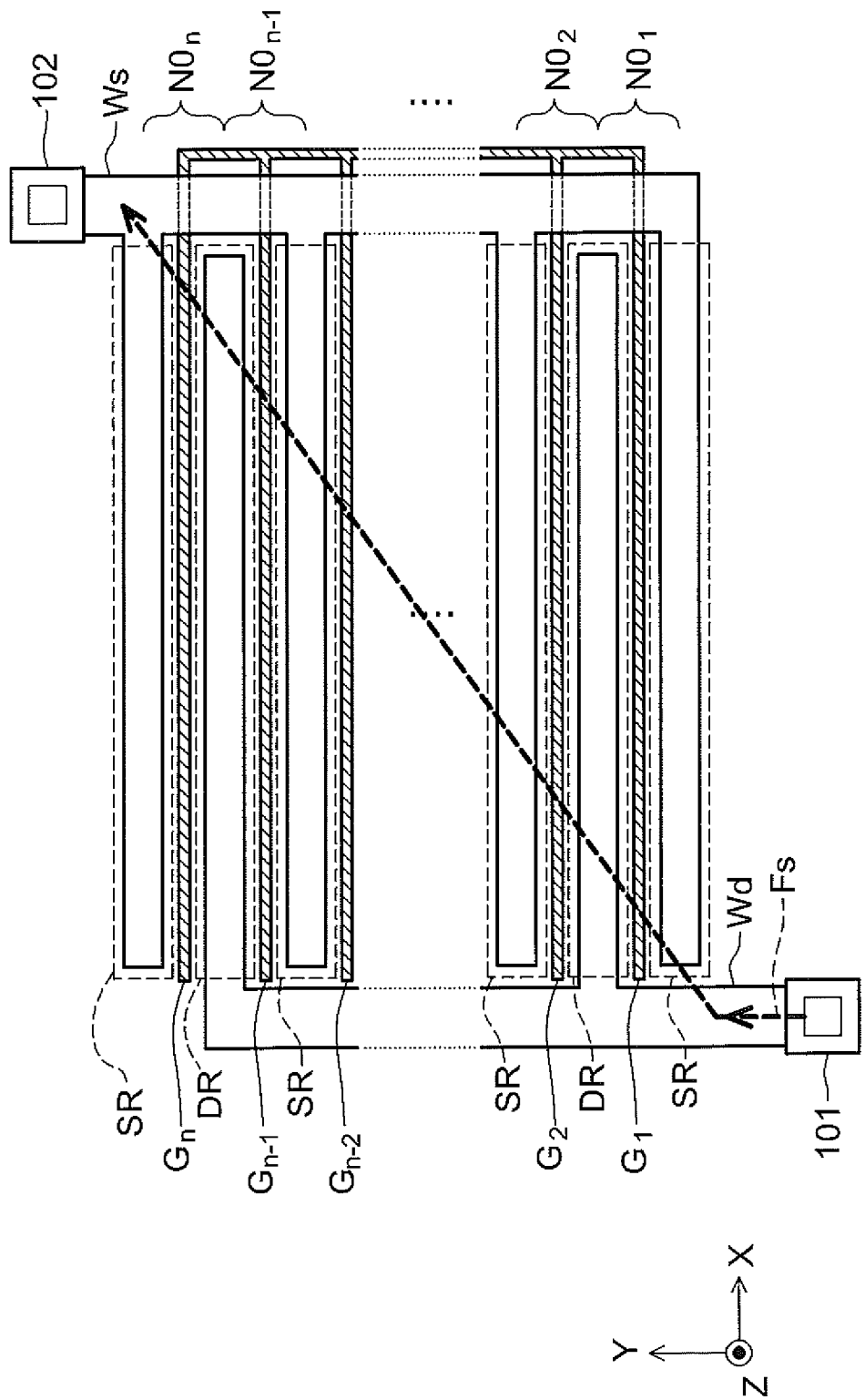
FIG. 8 is a diagram schematically illustrating another exemplary layout of the conventional surge protection circuit illustrated in FIG. 1.

In the layout illustrated in FIG. 7, when surge voltage is applied through the input terminal 101, the MOS transistors $N0_1, \ldots, N0_n$ turn on sequentially from the MOS transistor located closest to the input terminal 101, so that the propagation path of surge current Fs is almost limited to the MOS transistor $N0_1$, and surge current Fs hardly flows through the other MOS transistors $N0_2$ to $N0_n$. For this reason, potential of the input terminal 101 may not be lowered within a short time, so that the internal circuit 90 may be broken in response to the surge voltage. In order to prevent such non-conformity, it may be desirable to arrange the VSS terminal 102 diagonally to the input terminal 101, as illustrated in FIG. 8. In this configuration, surge current Fs flows over the entire area of the MOS transistors $N0_1, \ldots, N0_n$, but location of the VSS terminal 102 is limitative. This degrades its layout design flexibility.

In contrast, according to the layout of the first embodiment as illustrated in FIG. 3, surge current Fs can flow uniformly over the entire circuit irrespective of location of the VSS terminal 4, so that layout design flexibility can be increased.

Second Embodiment

Figure 9:
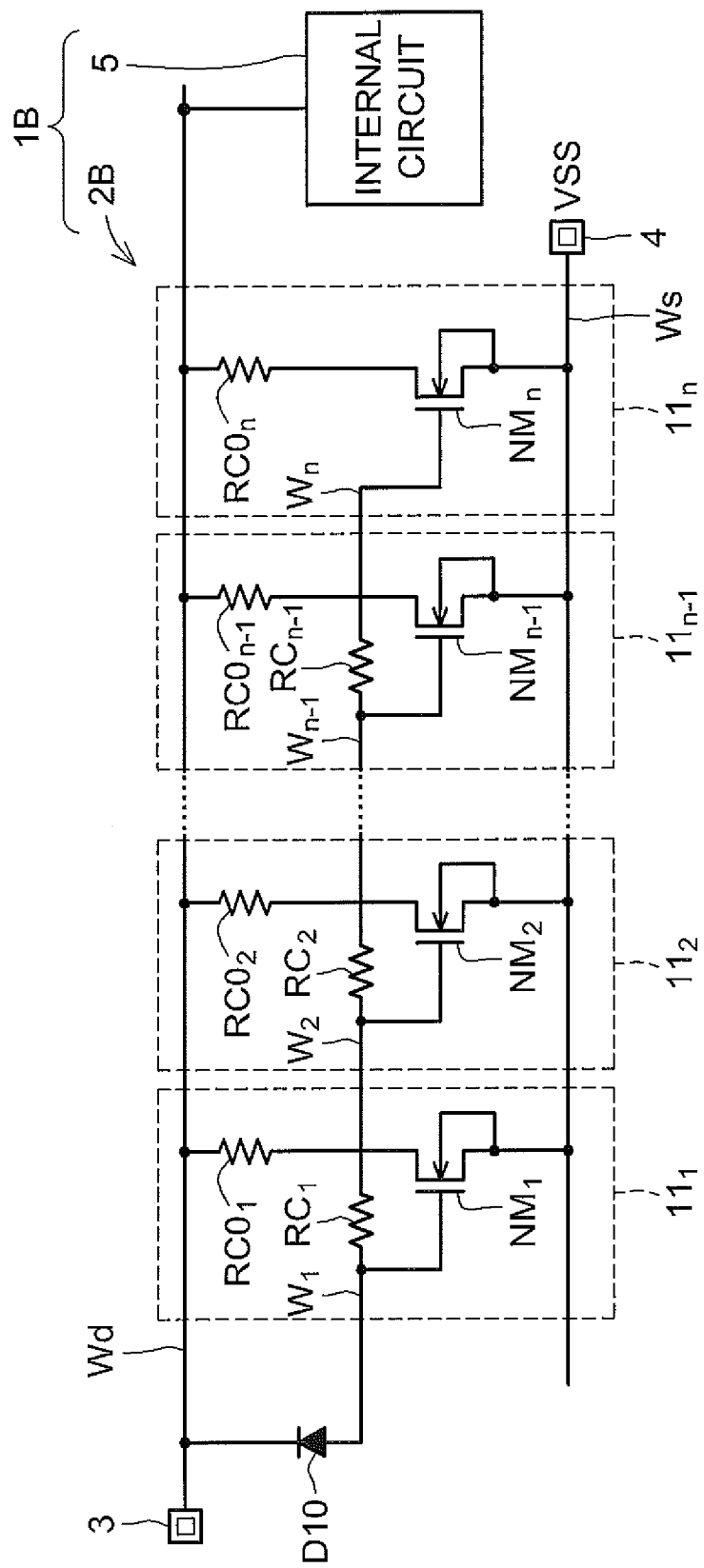
FIG. 9 is a diagram schematically illustrating a configuration of the semiconductor integrated circuit according to a second embodiment of the present invention.

Next, a second embodiment of the present invention will be explained. FIG. 9 is a diagram schematically illustrating a configuration of a semiconductor integrated circuit 1B of the second embodiment. The semiconductor integrated circuit 1B has an input terminal 3, an overvoltage protection circuit 2B, a VSS terminal 4 and an internal circuit 5. A configuration of the semiconductor integrated circuit 1B is almost same as the semiconductor integrated circuit 1A of the first embodiment, except that resistor elements $RC0_1$ to $RC0_n$ are provided in place of the resistor element RC0 of the semiconductor integrated circuit 1A illustrated in FIG. 2.

In the overvoltage protection circuit 2B of this embodiment, the resistor element $RC0_1$ to $RC0_n$ are respectively provided between the drains of the MOS transistors $NM_1$ to $NM_n$ and the interconnect line Wd which extends from the input terminal 3. More specifically, one end of the k-th-stage resistor element $RC0_k$ is connected to the drain of the MOS transistor $NM_k$, and the other end of the resistor element $RC0_k$ is connected to the interconnect line Wd.

Figure 10:
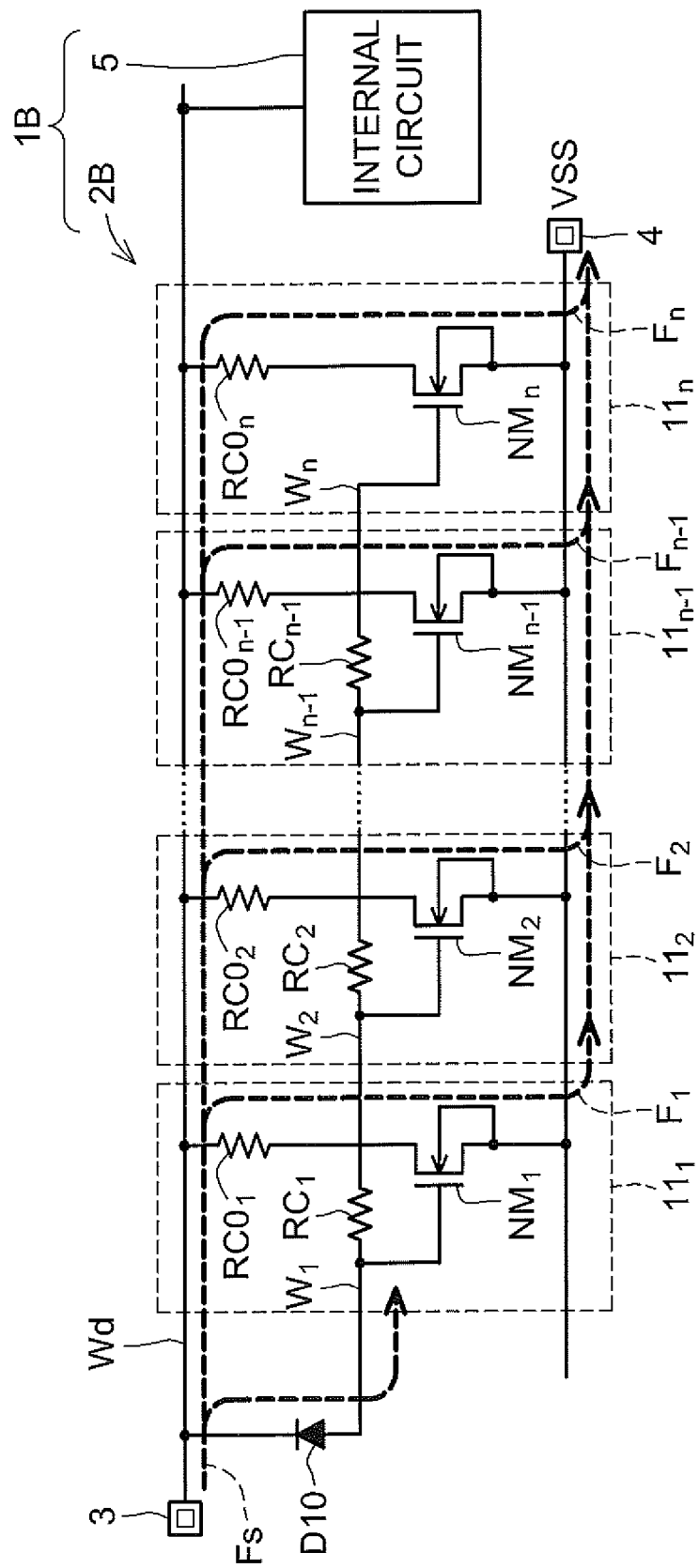
FIG. 10 is a diagram schematically illustrating the propagation and branching paths of surge current in the overvoltage protection circuit of the second embodiment.

Operations of the overvoltage protection circuit 2B of this embodiment will be explained below. FIG. 10 is a diagram schematically illustrating the propagation and branching paths of surge current Fs, when surge voltage is input through the input terminal 3.

When surge voltage which sharply increases with time is input through the input terminal 3, by virtue of presence of the resistor elements $RC0_1$ to $RC0_n$, the diode D10 goes into breakdown and starts to respond, in advance of breakdown of the internal circuit 5. The anode of the diode D10 then elevates potential of the interconnect line $W_1$. If the elevated potential exceeds the threshold value of the primary-stage MOS transistor $NM_1$, the MOS transistor $NM_1$ changes from off-state to on-state so as to establish electrical continuity, so that a path of current $F_1$ (surge path) is formed between the input terminal 3 and the VSS terminal 4. Thereafter, if potential of the interconnect line $W_k$ (k represents any of 2 to n) exceeds the threshold value of the k-th-stage MOS transistor $NM_k$, the MOS transistor $NM_k$ changes from off-state to on-state, and thereby a path of current $F_k$ (surge path) is formed between the input terminal 3 and the VSS terminal 4. By virtue of presence of the resistor element $RC_{k-1}$, the k-th-stage MOS transistor $NM_k$ turns on slightly behind the preceding-stage MOS transistor $NM_{k-1}$. Accordingly, when surge voltage is input through the input terminal 3, the MOS transistors $NM_1, \ldots, NM_n$ sequentially turn on, so as to form a path of surge current Fs between the input terminal 3 and the VSS terminal 4.

According to the surge protection circuit 2B of this embodiment, when surge voltage is applied through the input terminal 3, similarly as described in the first embodiment, the diode D10 leads to breakdown earlier than the internal circuit 5, so as to allow the MOS transistors $NM_1$ to $NM_n$ to turn on. Accordingly, surge current Fs can be drawn into the VSS terminal 4 within a short time, so that elements in the internal circuit 5 can surely be prevented from being destructed. For the case where the MOS transistors $NM_1, \ldots, NM_n$ of this embodiment are arranged according to the layout illustrated in FIG. 3, the MOS transistors $NM_1, \ldots, NM_n$ change from off-state to on-state in this order, so that the surge current paths are prevented from being localized in a limited area.

Moreover, in this embodiment, since the resistor element is not provided to the interconnect line Wd between the input terminal 3 and the internal circuit 5, so that voltage to be supplied from the input terminal 3 to the internal circuit 5 can be prevented from being dropped. Thus, the surge protection circuit 2B can have little effect on the internal circuit 5, thereby allowing the internal circuit 5 to operate as expected.

Third Embodiment

Figure 11:
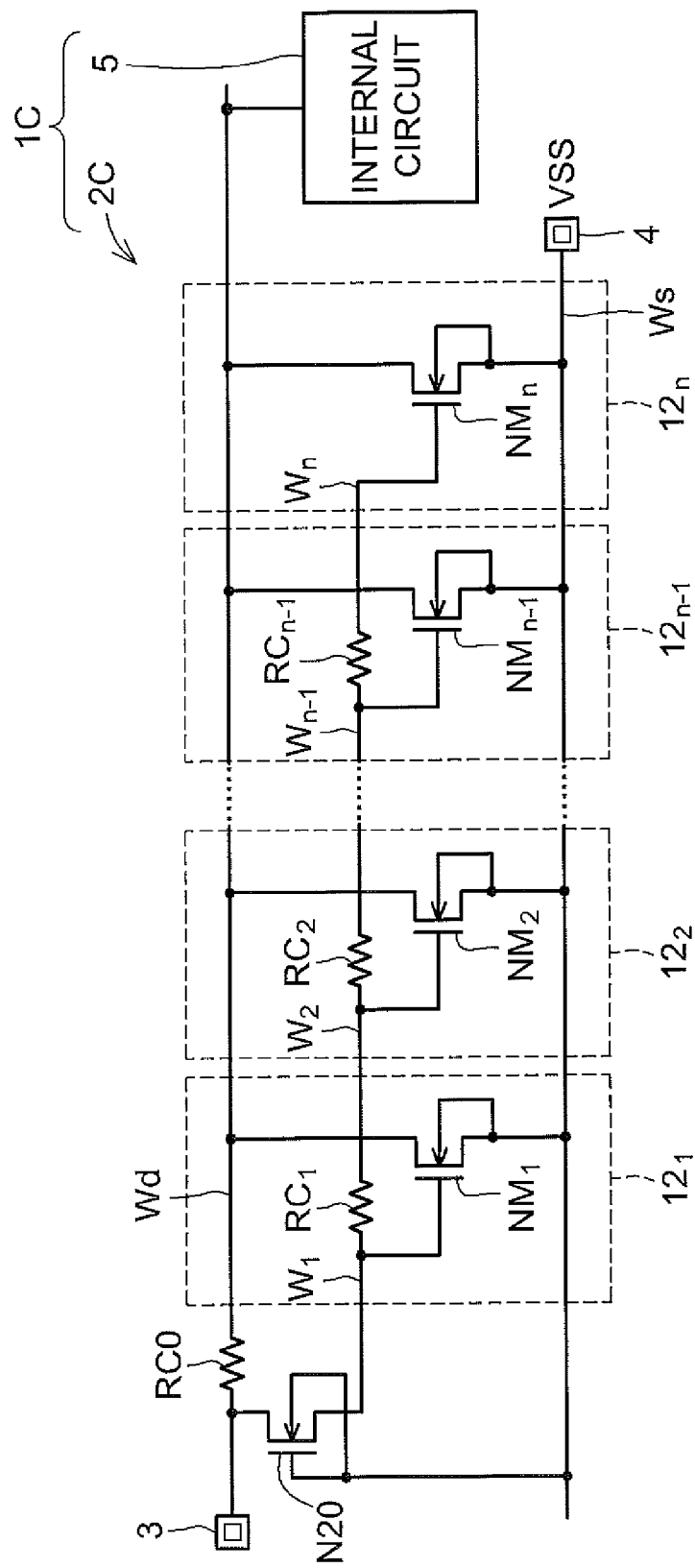
FIG. 11 is a diagram schematically illustrating a configuration of a semiconductor integrated circuit according to a third embodiment of the present invention.

Next, a third embodiment of the present invention will be explained. FIG. 11 is a diagram schematically illustrating a configuration of a semiconductor integrated circuit 10 of the third embodiment. The semiconductor integrated circuit 10 has an input terminal 3, an overvoltage protection circuit 2C, a VSS terminal 4 and an internal circuit 5. The configuration of the semiconductor integrated circuit 10 is nearly same with the configuration of the semiconductor integrated circuit 1A of the first embodiment, except that an n-channel MOS transistor N20 is provided as a rectifier, in place of the diode D10 of the semiconductor integrated circuit 1A illustrated in FIG. 2.

The source (input end) and the drain (output end) of the MOS transistor N20 are respectively connected to the input terminal 3 and the interconnect line $W_1$, and both of the gate and the back gate of the MOS transistor N20 are connected to the VSS terminal 4.

Figure 12:
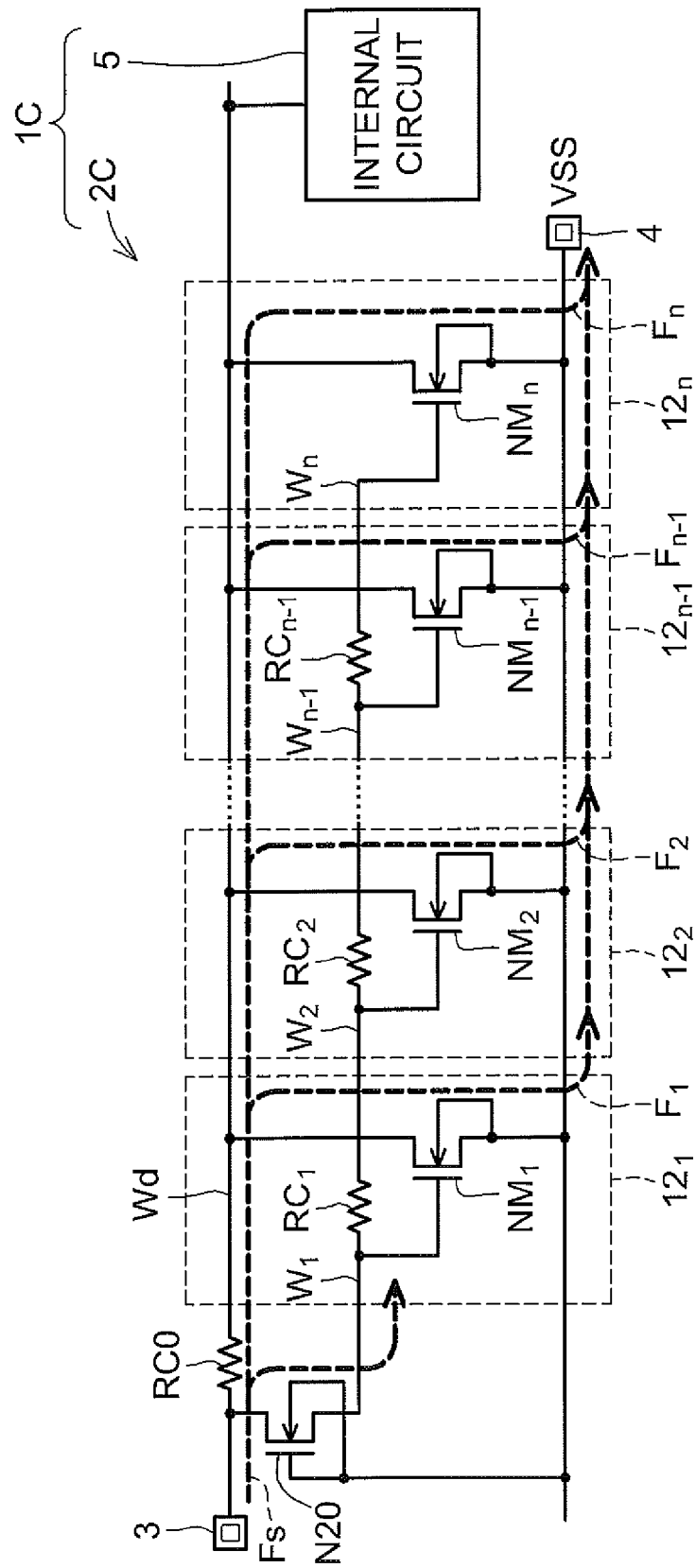
FIG. 12 is a diagram schematically illustrating the propagation and branching paths of surge current in the overvoltage protection circuit of the third embodiment.

Operations of the overvoltage protection circuit 2C of this embodiment will be explained. FIG. 12 is a diagram schematically illustrating the propagation and branching paths of surge current Fs, when surge voltage is input through the input terminal 3.

When surge voltage which sharply increases with time is input through the input terminal 3, by virtue of presence of the resistor element RC0, the pn junction of the MOS transistor N20 goes into breakdown and starts to respond, in advance of breakdown of the internal circuit 5. The MOS transistor N20 then elevates potential of the interconnect line $W_1$. If the elevated potential exceeds the threshold value of the primary-stage MOS transistor $NM_1$, the MOS transistor $NM_1$ changes from off-state to on-state so as to establish electrical continuity, so that a path of current $F_1$ (surge path) is formed between the input terminal 3 and the VSS terminal 4. Thereafter, if potential of the interconnect line $W_k$ (k represents any of 2 to n) exceeds the threshold value of the k-th-stage MOS transistor $NM_k$, the MOS transistor $NM_k$ changes from off-state to on-state, and thereby a path of current $F_k$ (surge path) is formed between the input terminal 3 and the VSS terminal 4. By virtue of presence of the resistor element $RC_{k-1}$, the k-th-stage MOS transistor $NM_k$ turns on slightly behind the preceding-stage MOS transistor $NM_{k-1}$. Accordingly, when surge voltage is input through the input terminal 3, the MOS transistors $NM_1, \ldots, NM_n$ sequentially turn on, so as to form a path of surge current Fs between the input terminal 3 and the VSS terminal 4.

According to the surge protection circuit 2C of this embodiment, when surge voltage is applied through the input terminal 3, the MOS transistor N20 leads to breakdown and causes the MOS transistors $NM_1$ to $NM_n$ to be turned on. Accordingly, surge current Fs can be drawn into the VSS terminal 4 within a short time, so that elements in the internal circuit 5 can surely be prevented from being destructed. For the case where the MOS transistors $NM_1, \ldots, NM_n$ of this embodiment are arranged according to the layout illustrated in FIG. 3, the MOS transistors $NM_1, \ldots, NM_n$ change from off-state to on-state in this order, so that the surge current paths are prevented from being localized in a limited area.

Moreover, this embodiment provides the overvoltage protection circuit 2C having an advanced surge protection performance, since the MOS transistor N20 adopted herein has higher breakdown-proof performance than the diode D10 has.

Fourth Embodiment

Figure 13:
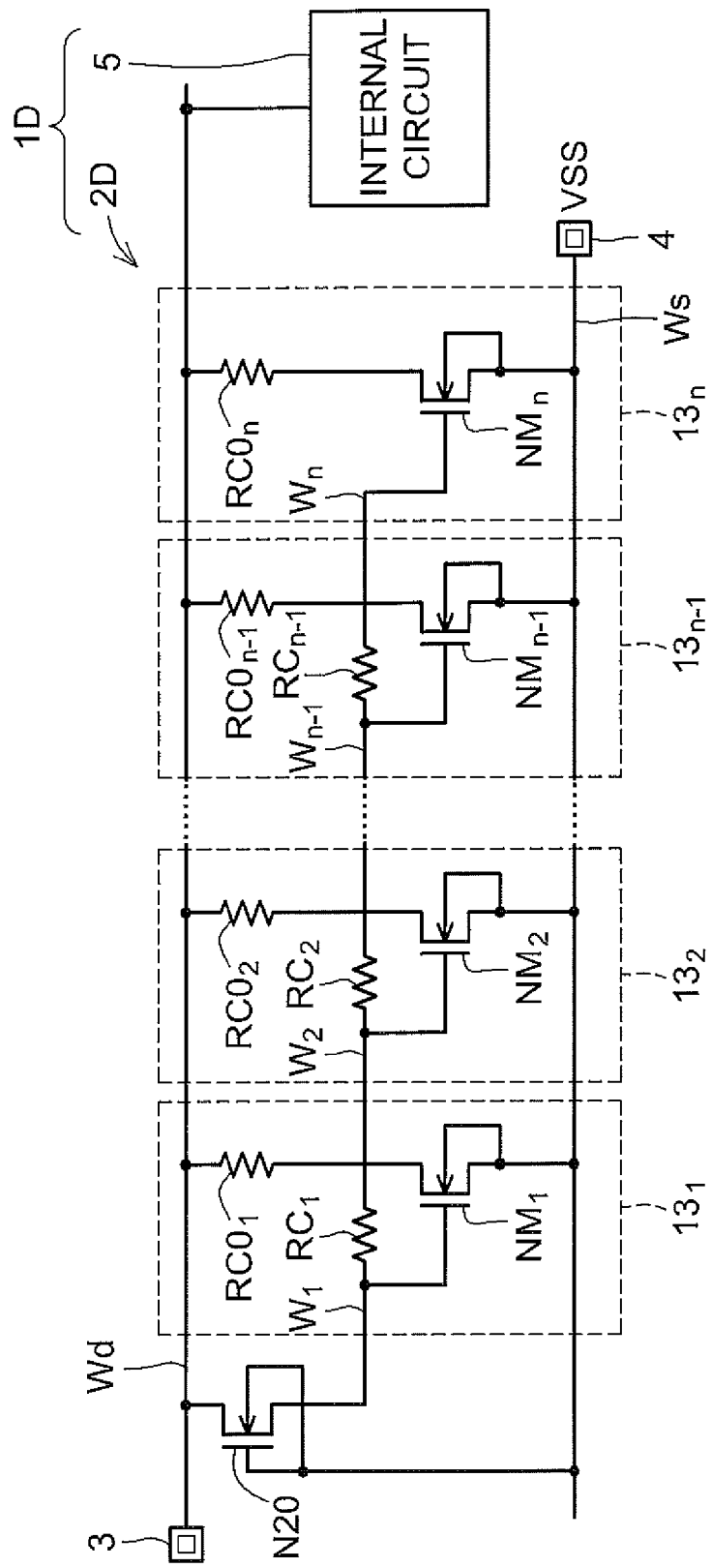
FIG. 13 is a diagram schematically illustrating a configuration of a semiconductor integrated circuit according to a fourth embodiment of the present invention.

Next, a fourth embodiment of the present invention will be explained. FIG. 13 is a diagram schematically illustrating a configuration of a semiconductor integrated circuit 1D of the fourth embodiment. The semiconductor integrated circuit 1D has an input terminal 3, an overvoltage protection circuit 2D, a VSS terminal 4 and an internal circuit 5. The configuration of the semiconductor integrated circuit 1D is almost same as the semiconductor integrated circuit 1C of the third embodiment, except that the resistor elements $RC0_1$ to $RC0_n$ are provided in place of the resistor element RC0 of the semiconductor integrated circuit 1C illustrated in FIG. 11.

The resistor elements $RC0_1$ to $RC0_n$ are provided respectively between the drains of the MOS transistors $NM_1$ to $NM_n$, and the interconnect line Wd extended from the input terminal 3. More specifically, one end of the k-th-stage resistor element $RC0_k$ is connected to the drain of the MOS transistor $NM_k$, and the other end of the resistor element $RC0_k$ is connected to the interconnect line Wd.

Figure 14:
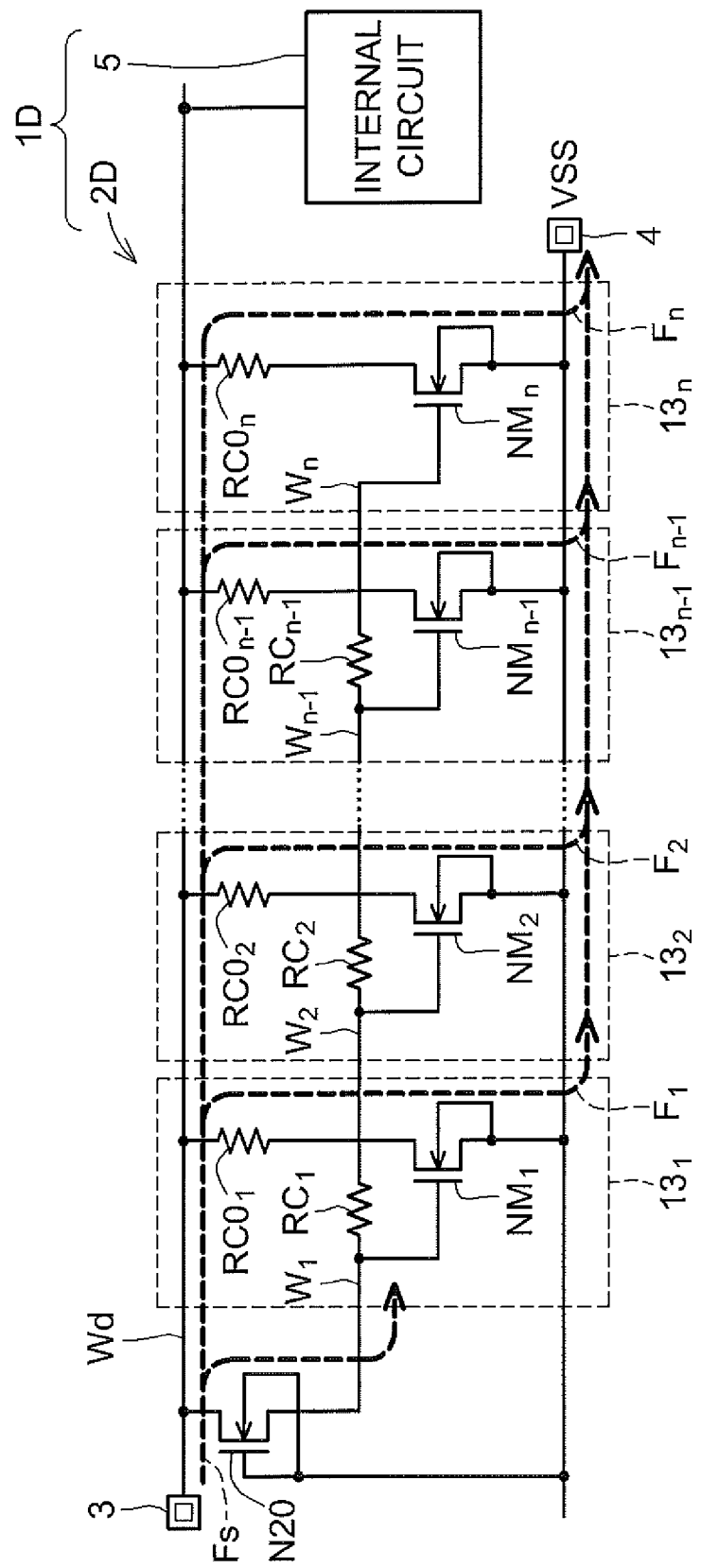
FIG. 14 is a diagram schematically illustrating the propagation and branching paths of surge current in the overvoltage protection circuit of the fourth embodiment.

Operations of the overvoltage protection circuit 2D of this embodiment will be explained. FIG. 14 is a diagram schematically illustrating the propagation and branching paths of surge current Fs, when surge voltage is input through the input terminal 3.

When surge voltage which sharply increases with time is input through the input terminal 3, by virtue of presence of the resistor elements $RC0_1$ to $RC0_n$, the pn junction of the MOS transistor N20 goes into breakdown and starts to respond, in advance of breakdown of the internal circuit 5. The MOS transistor N20 then elevates potential of the interconnect line $W_1$. If the elevated potential exceeds the threshold value of the primary-stage MOS transistor $NM_1$, the MOS transistor $NM_1$ changes from off-state to on-state so as to establish electrical continuity, so that a path of current $F_1$ (surge path) is formed between the input terminal 3 and the VSS terminal 4. Thereafter, if potential of the interconnect line $W_k$ (k represents any of 2 to n) exceeds the threshold value of the k-th-stage MOS transistor $NM_k$, the MOS transistor $NM_k$ changes from off-state to on-state, and thereby a path of current $F_k$ (surge path) is formed between the input terminal 3 and the VSS terminal 4. By virtue of presence of the resistor element $RC_{k-1}$, the k-th-stage MOS transistor $NM_k$ turns on slightly behind the preceding-stage MOS transistor $NM_{k-1}$. Accordingly, when surge voltage is input through the input terminal 3, the MOS transistors $NM_1, \ldots, NM_n$ sequentially turn on, so as to form a path of surge current Fs between the input terminal 3 and the VSS terminal 4.

According to the surge protection circuit 2D of this embodiment, when surge voltage is applied through the input terminal 3, similarly as described in the third embodiment, the MOS transistor N20 leads to breakdown earlier than the internal circuit 5, so as to allow the MOS transistors $NM_1$ to $NM_n$ to turn on. Accordingly, surge current Fs can be drawn into the VSS terminal 4 within a short time, so that elements in the internal circuit 5 can surely be prevented from being destructed. For the case where the MOS transistors $NM_1, \ldots, NM_n$ of this embodiment are arranged according to the layout illustrated in FIG. 3, the MOS transistors $NM_i, \ldots, NM_n$ change from off-state to on-state in this order, so that the surge current paths are prevented from being localized in a limited area.

In addition, since this embodiment has no resistor element provided on the interconnect line Wd between the input terminal 3 and the internal circuit 5, the voltage supplied through the input terminal 3 towards the internal circuit 5 can be prevented from being dropped. Thus, the surge protection circuit 2D can have little effect on the internal circuit 5, thereby allowing the internal circuit 5 to operate as expected.

Fifth Embodiment

Figure 15:
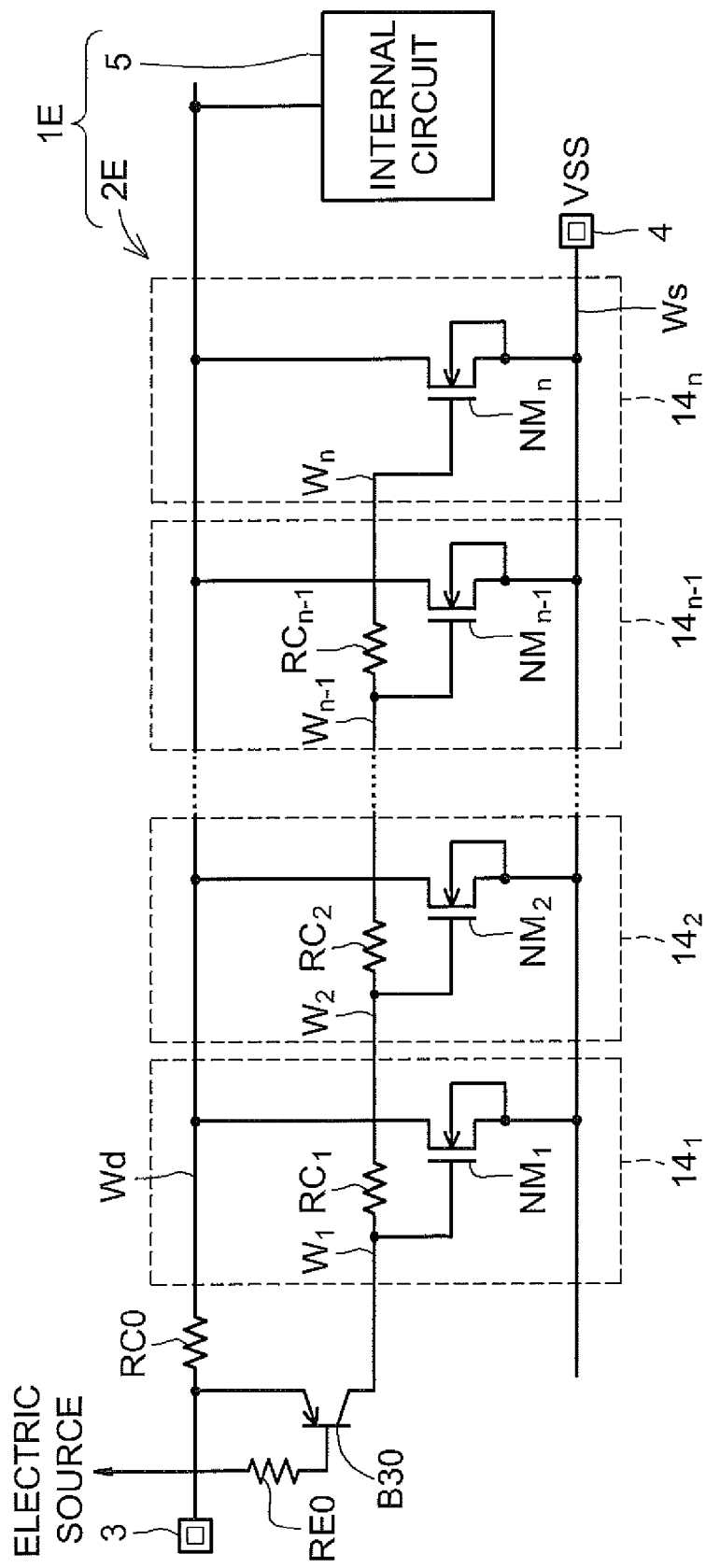
FIG. 15 is a diagram schematically illustrating a configuration of a semiconductor integrated circuit according to a fifth embodiment of the present invention.

Next, a fifth embodiment of the present invention will be explained. FIG. 15 is a diagram schematically illustrating a configuration of a semiconductor integrated circuit 1E of the fifth embodiment. The semiconductor integrated circuit 1E has an input terminal 3, an overvoltage protection circuit 2E, a VSS terminal 4 and an internal circuit 5. The configuration of the semiconductor integrated circuit 1E is almost same as the semiconductor integrated circuit 1A of the first embodiment, except that a bipolar transistor B30 is provided as a rectifier, in place of the diode D10 of the semiconductor integrated circuit 1A illustrated in FIG. 2.

As illustrated in FIG. 15, source voltage is supplied through the resistor element RE0 to the base of the bipolar transistor B30. The emitter (input end) and the collector (output end) of the bipolar transistor B30 are connected to the input terminal 3 and the interconnect line $W_1$, respectively.

Figure 16:
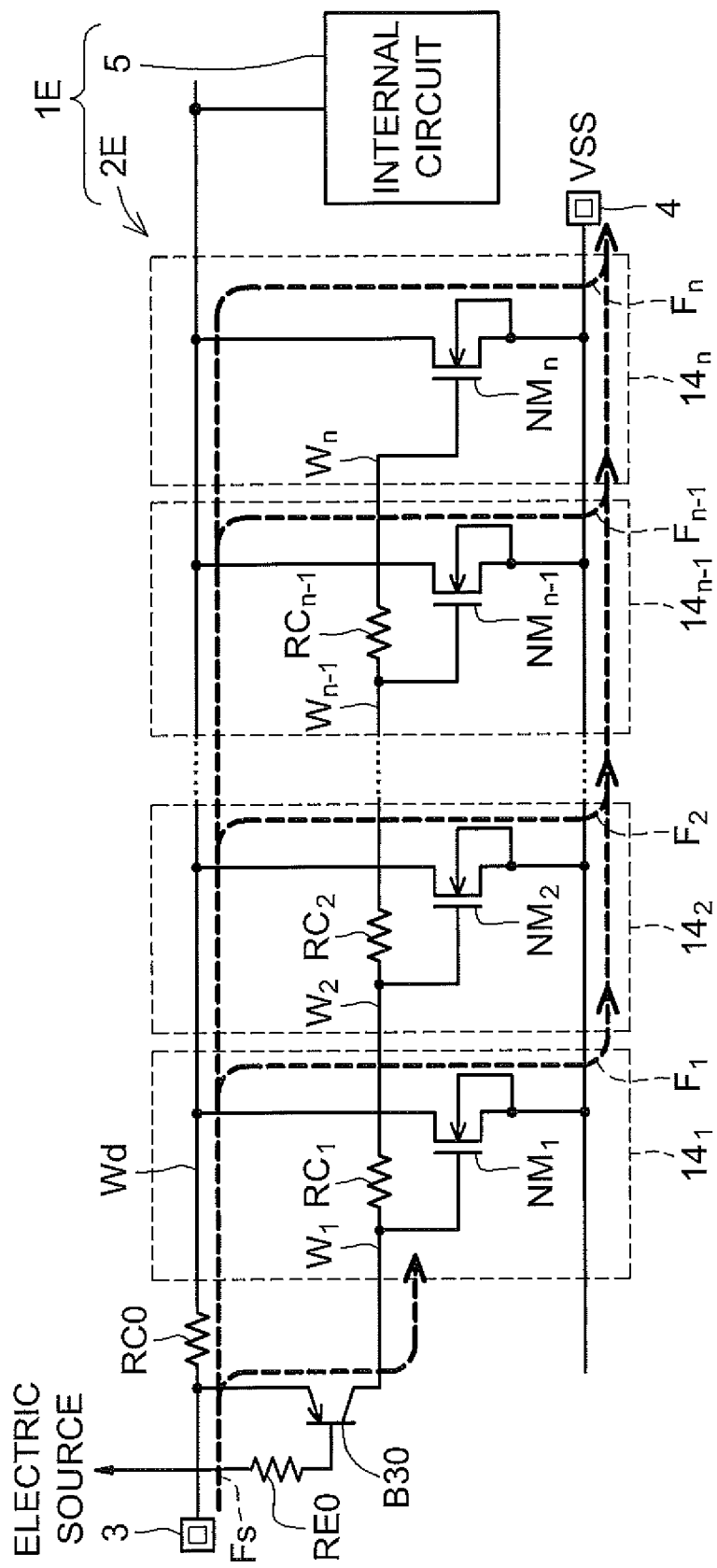
FIG. 16 is a diagram schematically illustrating the propagation and branching paths of surge current in the overvoltage protection circuit of the fifth embodiment.

Operations of the overvoltage protection circuit 2E of this embodiment will be explained. FIG. 16 is a diagram schematically illustrating the propagation and branching paths of surge current Fs, when surge voltage is input through the input terminal 3.

When surge voltage is input through the input terminal 3, by virtue of presence of the resistor element RC0, base current generates in the bipolar transistor B30 in advance of breakdown of the internal circuit 5, and thereby the bipolar transistor B30 turns on. The bipolar transistor B30 then elevates potential of the interconnect line $W_1$. If the elevated potential exceeds the threshold value of the primary-stage MOS transistor $NM_1$, the MOS transistor $NM_1$ changes from off-state to on-state so as to establish electrical continuity, so that a path of current $F_1$ (surge path) is formed between the input terminal 3 and the VSS terminal 4. Thereafter, if potential of the interconnect line $W_k$ (k represents any of 2 to n) exceeds the threshold value of the k-th-stage MOS transistor $NM_k$, the MOS transistor $NM_k$ changes from off-state to on-state, and thereby a path of current $F_k$ (surge path) is formed between the input terminal 3 and the VSS terminal 4. By virtue of presence of the resistor element $RC_{k-1}$, the k-th-stage MOS transistor $NM_k$ turns on slightly behind the preceding-stage MOS transistor $NM_{k-1}$. Accordingly, when surge voltage is input through the input terminal 3, the MOS transistors $NM_1, \ldots, NM_n$ sequentially turn on, so as to form a path of surge current Fs between the input terminal 3 and the VSS terminal 4.

According to the surge protection circuit 2E of this embodiment, when surge voltage is applied through the input terminal 3, the bipolar transistor B30 having been turned on allows the MOS transistors $NM_1$ to $NM_n$ to turn on. Accordingly, surge current Fs can be drawn into the VSS terminal 4 within a short time, so that elements in the internal circuit 5 can surely be prevented from being destructed. For the case where the MOS transistors $NM_1, \ldots, NM_n$ of this embodiment are arranged according to the layout illustrated in FIG. 3, the MOS transistors $NM_1, \ldots, NM_n$ change from off-state to on-state in this order, so that the surge current paths are prevented from being localized in a limited area.

In addition, since this embodiment involves no breakdown of the rectifier unlike the first to fourth embodiments described in the above, so that this embodiment ensures rapid response to surge, and fully exhibits a protective function against surge.

Sixth Embodiment

Figure 17:
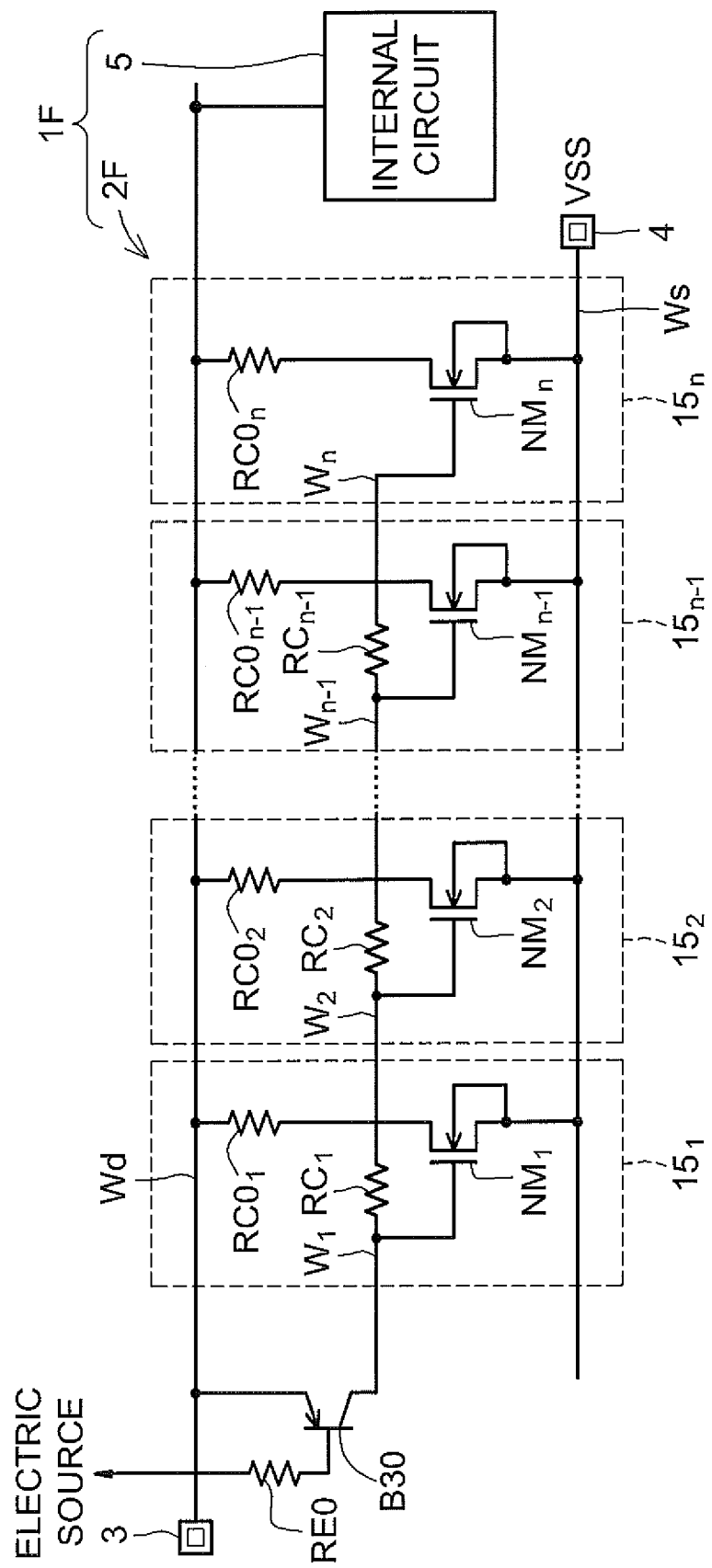
FIG. 17 is a diagram schematically illustrating a configuration of a semiconductor integrated circuit according to a sixth embodiment of the present invention.

Next, a sixth embodiment of the present invention will be explained below. FIG. 17 is a diagram schematically illustrating a configuration of a semiconductor integrated circuit 1F of the sixth embodiment. The semiconductor integrated circuit 1F has an input terminal 3, an overvoltage protection circuit 2F, a VSS terminal 4 and an internal circuit 5. The configuration of the semiconductor integrated circuit 1F is almost same as the semiconductor integrated circuit 1E of the fifth embodiment, except that resistor elements $RC0_1$ to $RC0_n$ are provided in place of the resistor element RC0 in the semiconductor integrated circuit 1E illustrated in FIG. 15.

The resistor elements $RC0_1$ to $RC0_n$ are provided respectively between the drains of the MOS transistors $NM_1$ to $NM_n$, and the interconnect line Wd extended from the input terminal 3. More specifically, one end of the k-th-stage resistor element $RC0_k$ is connected to the drain of the MOS transistor $NM_k$, and the other end of the resistor element $RC0_k$ is connected to the interconnect line Wd.

Figure 18:
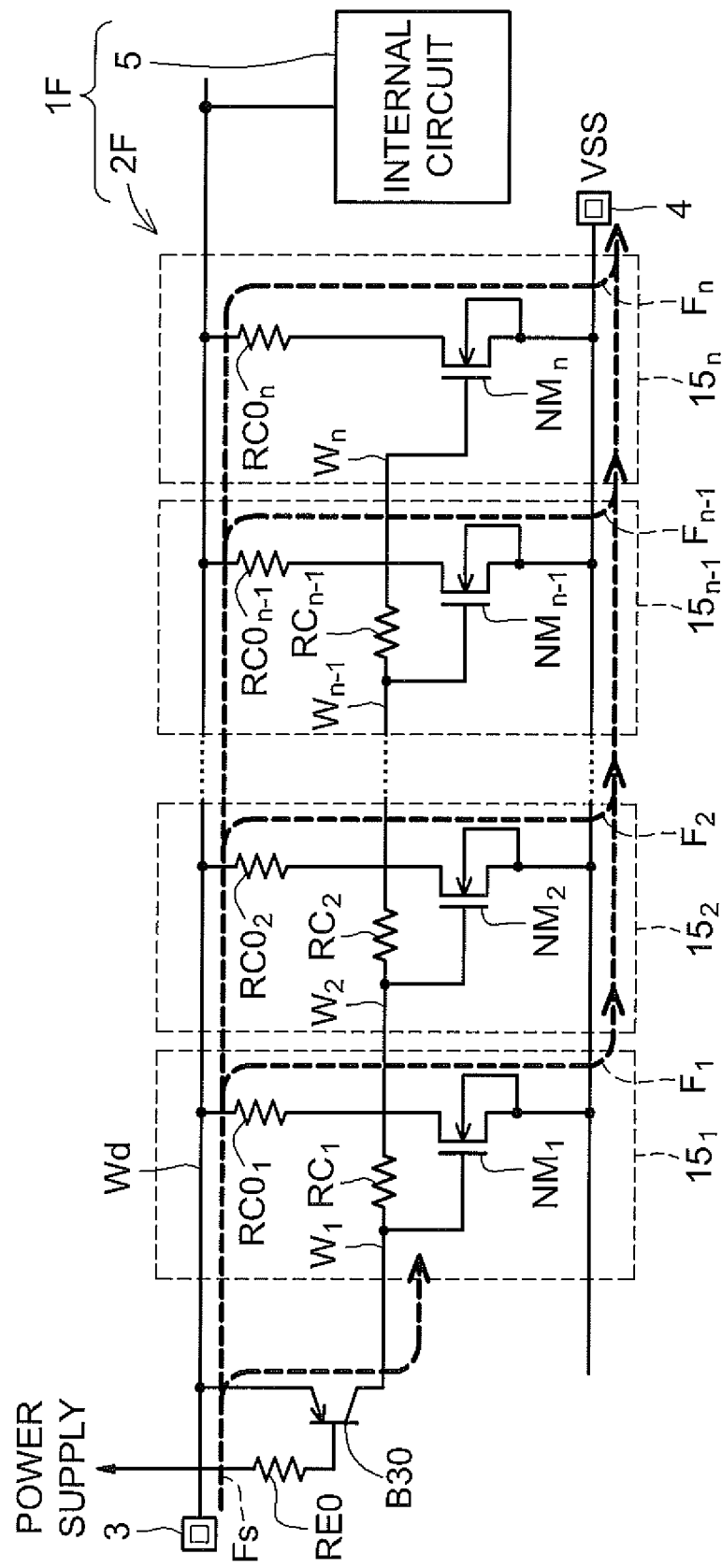
FIG. 18 is a diagram schematically illustrating the propagation and branching paths of surge current in the overvoltage protection circuit of the sixth embodiment.

Operations of the overvoltage protection circuit 2F of this embodiment will be explained. FIG. 18 is a diagram schematically illustrating the propagation and branching paths of surge current Fs, when surge voltage is input through the input terminal 3.

When surge voltage which sharply increases with time is input through the input terminal 3, by virtue of presence of the resistor elements $RC0_1$ to $RC0_n$, base current generates in the bipolar transistor B30 in advance of breakdown of the internal circuit 5, and thereby the bipolar transistor turns on. The bipolar transistor B30 then elevates potential of the interconnect line $W_1$. If the elevated potential exceeds the threshold value of the primary-stage MOS transistor $NM_1$, the MOS transistor $NM_1$ changes from off-state to on-state so as to establish electrical continuity, so that a path of current $F_1$ (surge path) is formed between the input terminal 3 and the VSS terminal 4. Thereafter, if potential of the interconnect line $W_k$ (k represents any of 2 to n) exceeds the threshold value of the k-th-stage MOS transistor $NM_k$, the MOS transistor $NM_k$ changes from off-state to on-state, and thereby a path of current $F_k$ (surge path) is formed between the input terminal 3 and the VSS terminal 4. By virtue of presence of the resistor element $RC_{k-1}$, the k-th-stage MOS transistor $NM_k$ turns on slightly behind the preceding-stage MOS transistor $NM_{k-1}$. Accordingly, when surge voltage is input through the input terminal 3, the MOS transistors $NM_1, \ldots, NM_n$ sequentially turn on, so as to form a path of surge current Fs between the input terminal 3 and the VSS terminal 4.

According to the surge protection circuit 2F of this embodiment, when surge voltage is applied through the input terminal 3, the bipolar transistor 230 having been turned on allows the MOS transistors $NM_1$ to $NM_n$ to turn on. Accordingly, surge current Fs can be drawn into the VSS terminal 4 within a short time, so that elements in the internal circuit 5 can surely be prevented from being destructed. For the case where the MOS transistors $NM_1, \ldots, NM_n$ of this embodiment are arranged according to the layout illustrated in FIG. 3, the MOS transistors $NM_1, \ldots, NM_n$ change from off-state to on-state in this order, so that the surge current paths are prevented from being localized in a limited area. In addition, by virtue of use of the bipolar transistor 230, this embodiment ensures rapid response to surge, and fully exhibits a protective function against surge.

In addition, since this embodiment has no resistor element provided on the interconnect line Wd between the input terminal 3 and the internal circuit 5, the voltage supplied through the input terminal 3 towards the internal circuit 5 can be prevented from being dropped. Thus, the surge protection circuit 2F can have little effect on the internal circuit 5, thereby allowing the internal circuit 5 to operate as expected.

The various embodiments of the present invention have been explained in the above with reference to the attached drawings. In the first to sixth embodiments described in the above, the MOS transistors $NM_1$ to $NM_n$ can be used, no limitation thereto intended. Alternatively, MIS transistors which have MIS (Metal-Insulator-Semiconductor) structures can be used in place of the MOS transistors $NM_1$ to $NM_n$.

Those skilled in the art will recognize that further variations are possible within the scope of the invention, which is defined in the appended claims.

What is claimed is:

1. An overvoltage protection circuit comprising:
   a first terminal through which a first voltage is supplied to an internal circuit;
   a second terminal through which a second voltage is supplied;
   a rectifier which has an input end connected to the first terminal, and an output end; and
   first-stage to n-th-stage switching elements which are connected in parallel to one another where n is an integer of 2 or larger,
   the first-stage to n-th-stage switching elements having first to n-th controlling ends respectively through which an output voltage from the output end of the rectifier is applied,
   each of the switching elements having first and second controlled ends connected to the first terminal and the second terminal respectively,
   the rectifier being configured to output a control voltage from the output end thereby to cause the first-stage to n-th-stage switching elements to be turned on to establish electrical continuity between the first and second controlled ends, in response to receipt of an overvoltage not smaller than a predetermined voltage that is higher than the second voltage from the first terminal.

2. The overvoltage protection circuit according to claim 1, further comprising a first resistor element which is connected between the output end of the rectifier and the k-th controlling end of the first to n-th controlling ends where k is an arbitrary integer from 2 to n, and is further connected between the k-th controlling end and the (k−1)-th controlling end of the first to n-th controlling ends.

3. The overvoltage protection circuit according to claim 1, further comprising a second resistor element which is connected between the first controlled ends of the first-stage to n-th-stage switching elements and the first terminal, and is connected also between the first controlled ends of the first-stage to n-th-stage switching elements and the input end of the rectifier, the first controlled ends being connected to the first terminal through the second resistor element.

4. The overvoltage protection circuit according to claim 3, wherein the second resistor element is connected between the first terminal and the internal circuit.

5. The overvoltage protection circuit according to claim 1, further comprising:

an interconnect which is connected to the first terminal; and a second resistor element which is connected between the interconnect and the first controlled end of each of the first-stage to n-th-stage switching elements, the first controlled end being connected to the first terminal through the second resistor element and the interconnect.

6. The overvoltage protection circuit according to claim 5, wherein the first terminal is connected to the internal circuit through the interconnect.

7. The overvoltage protection circuit according to claim 1, wherein the first-stage to n-th-stage switching elements have first-stage to n-th-stage n-channel MIS transistors respectively, each of the first-stage to n-th-stage MIS transistors including:

a gate electrode formed over a gate insulating film on a semiconductor substrate and constituting one of the first to n-th controlling ends;

a source region formed on one side of the gate electrode and constituting the second controlled end; and a drain region formed on the other side of the gate electrode and constituting the first controlled end.

8. The overvoltage protection circuit according to claim 7, wherein:

the first to n-th controlling ends are arranged in ascending order of distance in interconnect length from the output end of the rectifier;

the first-stage to n-th-stage MIS transistors are arranged in a first direction which extends in parallel with a main surface of the semiconductor substrate;

the source region, the gate electrode and the drain region are arranged in the first direction; and the interconnect length between the first terminal and the first controlled end of the first-stage MIS transistor is the largest among interconnect lengths between the first terminal and the first controlled ends of the first-stage to n-th-stage MIS transistors.

9. The overvoltage protection circuit according to claim 8, wherein an interconnect length between the first terminal and the first controlled end of the m-th-stage MIS transistor of the first-stage to n-th-stage MIS transistors is shorter than an interconnect length between the first terminal and the first controlled end of the (m−1)-th-stage MIS transistor of the first-stage to n-th-stage MIS transistors, where m is an arbitrary integer from 2 to n.

10. The overvoltage protection circuit according to claim 8, wherein an interconnect length between the second terminal and the second controlled end of the first-stage MIS transistor is the longest among interconnect lengths between the second terminal and the second controlled ends of the first-stage to n-th-stage MIS transistors.

11. The overvoltage protection circuit according to claim 1, wherein the rectifier has a pn junction which leads to breakdown when a reverse bias not smaller than a breakdown voltage is applied as the overvoltage between the input end and the output end.

12. The overvoltage protection circuit according to claim 11, wherein the rectifier is a pn-junction-type diode.

13. The overvoltage protection circuit according to claim 11, wherein the rectifier is an MIS transistor having the pn junction as a parasitic diode.

14. The overvoltage protection circuit according to claim 1, wherein the rectifier is a bipolar transistor which changes from off-state to on-state in response to receipt of the overvoltage from the first terminal.

15. A semiconductor integrated circuit, comprising: the overvoltage protection circuit of claim 1; and the internal circuit.

* * * * *